United States Patent
Ikegami et al.

(10) Patent No.: US 8,399,928 B2
(45) Date of Patent: Mar. 19, 2013

(54) SEMICONDUCTOR DEVICE

(75) Inventors: Tomoaki Ikegami, Hyogo (JP);
Kazuyuki Nakanishi, Kyoto (JP);
Masaki Tamaru, Kyoto (JP)

(73) Assignee: Panasonic Corporation, Osaka (JP)

( * ) Notice: Subject to any disclaimer, the term of this patent is extended or adjusted under 35 U.S.C. 154(b) by 67 days.

(21) Appl. No.: 13/179,214

(22) Filed: Jul. 8, 2011

(65) Prior Publication Data
US 2011/0284964 A1    Nov. 24, 2011

Related U.S. Application Data

(63) Continuation of application No. PCT/JP2011/000927, filed on Feb. 18, 2011.

(30) Foreign Application Priority Data

May 18, 2010   (JP) ................................. 2010-114517

(51) Int. Cl.
*H01L 21/00* (2006.01)
(52) U.S. Cl. . 257/359; 257/355; 257/357; 257/E29.242; 438/599; 438/129
(58) Field of Classification Search .................. 257/355, 257/356, 357, E29.242; 438/599, 129
See application file for complete search history.

(56) References Cited

U.S. PATENT DOCUMENTS

| | | | | |
|---|---|---|---|---|
| 5,500,542 A | * | 3/1996 | Iida et al. | 257/210 |
| 5,672,895 A | * | 9/1997 | Iida et al. | 257/357 |
| 6,002,155 A | * | 12/1999 | Tahara et al. | 257/355 |
| 6,600,341 B2 | * | 7/2003 | Bingert et al. | 326/102 |
| 6,822,477 B1 | * | 11/2004 | Bingert et al. | 326/41 |
| 2006/0199325 A1 | | 9/2006 | Maeno et al. | |
| 2008/0224176 A1 | | 9/2008 | Nakanishi et al. | |
| 2010/0006896 A1 | | 1/2010 | Uemura | |

FOREIGN PATENT DOCUMENTS

| | | |
|---|---|---|
| JP | 2000-106419 | 4/2000 |
| JP | 2006-245390 | 9/2006 |
| JP | 2007-042718 | 2/2007 |
| JP | 2008-235350 | 10/2008 |
| JP | 2010-021469 | 1/2010 |
| WO | WO 2006/118098 A1 | 11/2006 |

* cited by examiner

*Primary Examiner* — Jarrett Stark
*Assistant Examiner* — Nicholas Tobergte
(74) *Attorney, Agent, or Firm* — McDermott Will & Emery LLP

(57) ABSTRACT

A standard cell has gate patterns extending in Y direction and arranged at an equal pitch in X direction. End portions of the gate patterns are located at the same position in Y direction, and have an equal width in X direction. A diode cell is located next to the standard cell in Y direction, and includes a plurality of opposite end portions formed of gate patterns that are opposed to the end portions, in addition to a diffusion layer which functions as a diode.

8 Claims, 14 Drawing Sheets

SEMICONDUCTOR DEVICE

CROSS-REFERENCE TO RELATED APPLICATION

This is a continuation of PCT International Application PCT/JP2011/000927 filed on Feb. 18, 2011, which claims priority to Japanese Patent Application No. 2010-114517 filed on May 18, 2010. The disclosures of these applications including the specifications, the drawings, and the claims are hereby incorporated by reference in their entirety.

BACKGROUND

The present disclosure relates to layouts of semiconductor devices, and specifically relates to techniques effective for reducing an optical proximity effect.

In a general process for fabricating a semiconductor integrated circuit, a photolithography step including application of a resist, light exposure, and development, an etching step for patterning elements using a resist mask, and a step of removing the resist are repeated to form an integrated circuit on a semiconductor substrate. If pattern dimensions are equal to or smaller than the wavelength of the exposure light in the photolithography step, differences between the designed layout dimensions and the pattern dimensions formed on the semiconductor substrate become large due to an optical proximity effect of the diffracted light.

In a semiconductor integrated circuit, the gate length of a transistor is an important factor which influences the performance of the semiconductor integrated circuit. Thus, if variations in gate dimensions occur in the fabrication process, it significantly affects the operational performance of the semiconductor integrated circuit.

For this reason, with the progression of miniaturization, it becomes essential to correct the variations in pattern dimensions caused by the optical proximity effect, when patterns such as a wire are drawn and exposed to light in the fabrication process of the semiconductor integrated circuit. Examples of the technique for correcting the optical proximity effect include an optical proximity effect correction (OPC). The OPC is a technique in which an amount of change in the gate length due to an optical proximity effect is predicted from a distance between a gate and its adjacent gate pattern, and the mask measurements of the photoresist for forming the gate are corrected beforehand to compensate the predicted amount of change, thereby maintaining the finished measurements of the gate length after light exposure constant.

However, in conventional techniques, gate patterns have not been standardized and there have been various gate lengths and gate spaces on the entire chip. Thus, problems such as an increase in turn around time (TAT) or an increase in amount of processing are caused by the gate mask correction by OPC.

SUMMARY

According to Japanese Patent Publication No. 2000-106419, for example, a protection diode is used for satisfying an antenna rule. However, in general, no gate is provided on a diode cell, and therefore, there are no regulations for the gate length and the gate space. Thus, the gate dimensions cannot be regulated. Here, a diode cell is a cell which forms an diode for protecting a transistor from a phenomenon referred to as an "antenna effect" in which electro static discharge (ESD) occurs because the gate of the transistor or a metal wire connected to the gate is charged due to irradiation of plasma.

FIG. 14 shows an example layout pattern of a semiconductor device having a conventional diode cell. In FIG. 14, gate patterns G1, G2, G3 are provided in the standard cell C1. The diode cell C2 includes a first diode A1 and a second diode A2 connected to each other in series and in a forward direction. A contact for connecting a diffusion region and a metal wire in the upper layer, and an input connection terminal IN placed on the metal wire in the upper layer are provided between the first diode A1 and the second diode A2. With this configuration, the diode cell C2 functions as a bypass of a charge current path passing through a gate oxide film of the MOS transistor, and functions as a protection diode cell for satisfying the antenna rule.

Here, gate patterns opposed to the end portions of the gate patterns G1, G2, G3 do not exist in a region R1. Thus, the end portions of the gate patterns G1, G2, G3 do not have shape regularity, which leads to variations of the gate length due to an optical proximity effect.

It is an objective of the present invention to provide, in a semiconductor device having a diode cell, a layout of a standard cell located next to the diode cell according to which variations in gate length caused by an optical proximity effect can be reliably prevented.

According to one aspect of the present invention, a semiconductor device includes: a standard cell having three or more gate patterns extending in a first direction and arranged at an equal pitch along a second direction orthogonal to the first direction; and a diode cell located next to the standard cell in the first direction, wherein the gate patterns included in the standard cell terminate near a cell boundary between the standard cell and the diode cell, with respective end portions located at a same position in the first direction and having an equal width in the second direction, and the diode cell includes: at least one diffusion layer which functions as a diode; and a plurality of opposite end portions formed of a gate pattern, which are located near the cell boundary and opposed to the end portions of the gate patterns included in the standard cell.

According to this aspect of the present invention, the standard cell includes three or more gate patterns arranged at an equal pitch, and the diode cell is located next to the standard cell in the first direction. The end portions of the gate patterns included in the standard cell near the cell boundary are located at the same position in the first direction, and have an equal width in the second direction. Further, the diode cell includes, in addition to at least one diffusion layer which functions as a diode, a plurality of opposite end portions formed of gate patterns and opposed to the end portions of the gate patterns included in the standard cell near the cell boundary. With this configuration, the end portions of the gate patterns in the standard cell can have shape regularity by the presence of the opposite end portions formed of the gate patterns in the diode cell. Thus, it is possible to reliably prevent variations in gate length caused by an optical proximity effect.

According to a semiconductor device of the present invention, it is possible to reliably prevent variations in gate length caused by an optical proximity effect, in a standard cell located next to a diode cell.

DETAILED DESCRIPTION

Embodiments of the present invention will be described hereinafter with reference to the drawings.

First Embodiment

Figure 1:
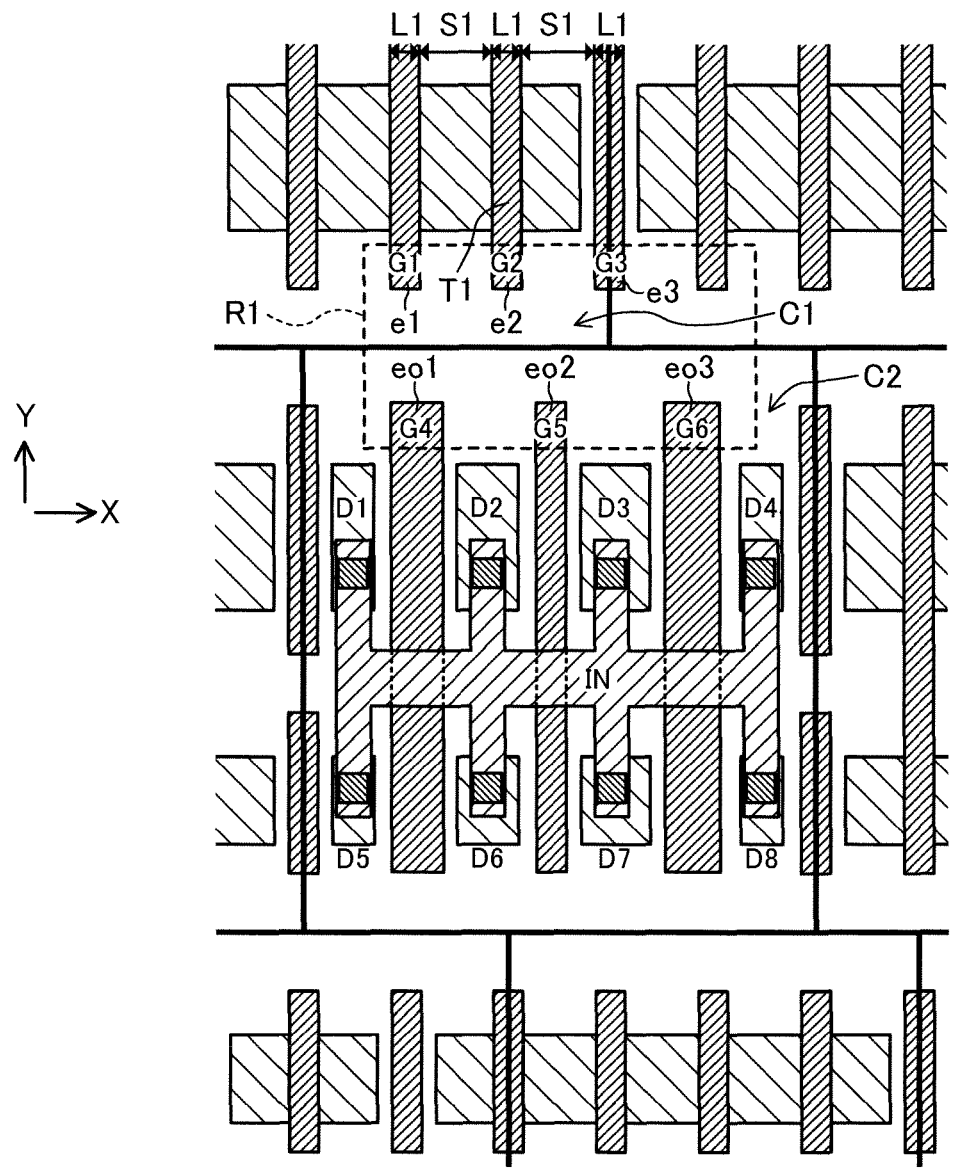
FIG. 1 is a simplified view of a layout pattern of a semiconductor device according to the first embodiment.

FIG. 1 is a simplified view of a layout pattern of a semiconductor device according to the first embodiment. FIG. 1 shows a layout of gate patterns, diffusion regions, contacts, and a metal wire. The cell boundary between adjacent cells is shown in solid line as in the other drawings. The gate pattern refers to a pattern formed in a layer used for a gate electrode of a transistor, and is made of material such as polysilicon. The transistor is configured by the gate pattern and the diffusion regions. Part of the gate pattern that is sandwiched between the diffusion regions functions as a gate of the transistor. As shown in FIG. 1, the standard cell C1 extends in Y direction (i.e., the longitudinal direction of the drawing) as a first direction, and includes gate patterns G1, G2, G3 arranged at an equal pitch in X direction (i.e., the lateral direction of the drawing) as a second direction. The width of each of the gate patterns G1, G2, G3 is L1, and the space between adjacent ones of the gate patterns G1, G2, G3 is S1. The gate pattern G2 forms a transistor T1. In general, to place a transistor at a higher area efficiency, the width L1 and the space S1 of the gate patterns G1, G2, G3 have a minimum dimension. Regarding the standard cell C1, a layout of only a gate pattern and a diffusion region is shown, and a contact and a metal wire are not shown as in the other drawings.

The diode cell C2 is located next to the standard cell C1 in Y direction. The diode cell C2 includes diffusion region patterns D1-D8 for forming a diffusion region which functions as a diode. The diffusion regions D1-D8 are connected to each other by a metal wire in the upper layer, and an input connection terminal IN is provided, so the diode cell C2 functions as a protection diode. The diffusion regions D1-D4 and the diffusion regions D5-D8 have the same lengths in Y direction, respectively. Further, the diode cell C2 includes a plurality of gate patterns G4, G5, G6 extending in Y direction. The gate patterns G4, G5, G6 are dummy patterns, and have an equal length in Y direction. Each of the diffusion regions D1-D8 is located between gate patterns including the gate patterns G4, G5, G6.

Now, an end portion region R1 in which the gate patterns G1, G2, G3 included in the standard cell C1 are opposed to the gate patterns G4, G5, G6 included in the diode cell C2 will be described. The gate patterns G1, G2, G3 terminate near the cell boundary between the standard cell C1 and the diode cell C2. The end portions e1, e2, e3 of the gate patterns G1, G2, G3 are located at the same position in Y direction, and have an equal width in X direction (i.e., the width L1). The gate patterns G4, G5, G6 have a plurality of opposite end portions eo1, eo2, eo3 opposed to the end portions e1, e2, e3 of the gate patterns G1, G2, G3. The opposite end portions eo1, eo2, eo3 are located at the same position in Y direction. In other words, the gate patterns G1, G2, G3 included in the standard cell C1 are spaced apart from the gate patterns G4, G5, G6 included in the diode cell C2 at an equal distance in Y direction. Thus, the gate patterns G1, G2, G3 have shape regularity, and variations in gate length caused by an optical proximity effect can be prevented.

Figure 2:
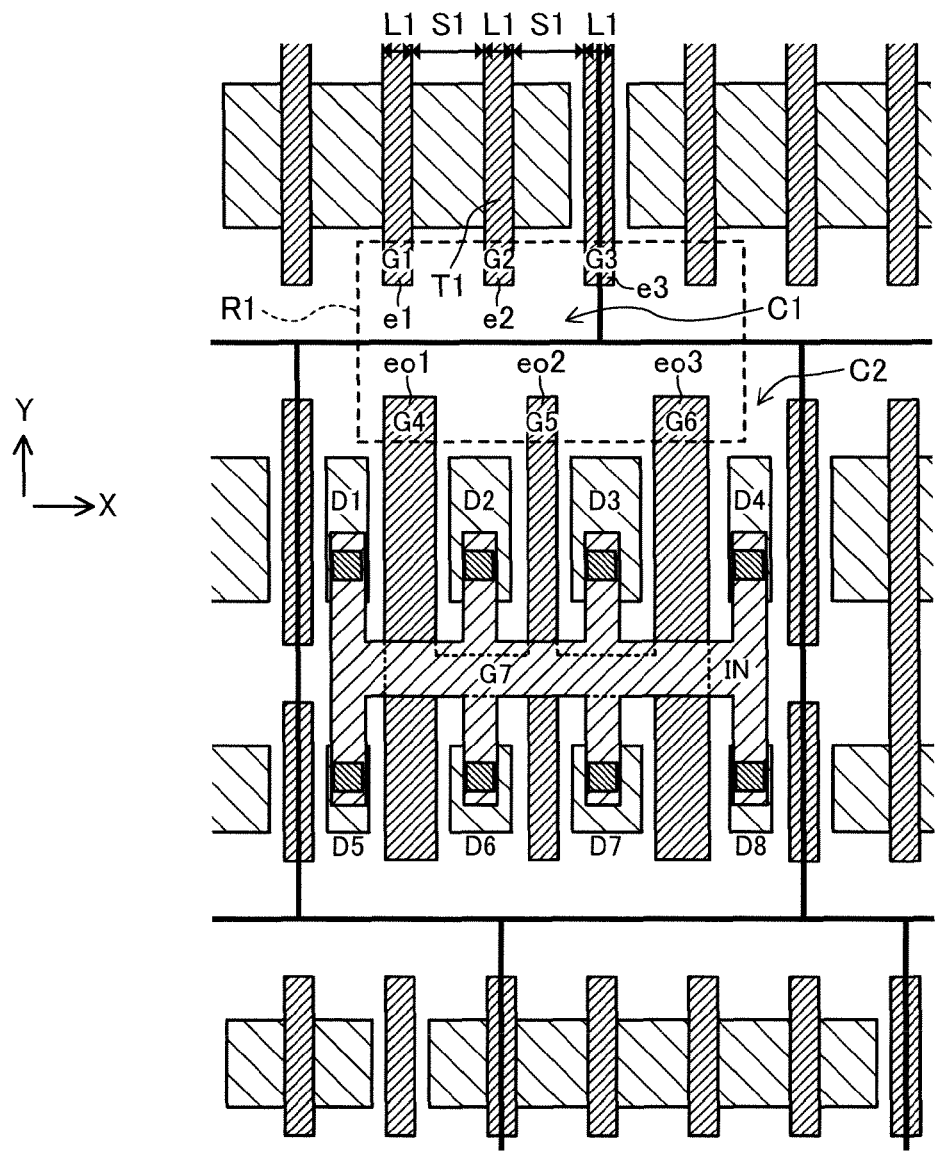
FIG. 2 is a simplified view of a layout pattern of a semiconductor device according to a variation of the first embodiment.

FIG. 2 is a simplified view of a layout pattern of a semiconductor device according to a variation of the present embodiment. The configuration shown in FIG. 2 is approximately the same as the configuration shown in FIG. 1, but the shapes of the gate patterns in the diode cell C2 is slightly different. Specifically, in addition to the gate patterns G4, G5, G6 extending in Y direction, a gate pattern G7 as a second gate pattern extending in X direction is provided. The gate pattern G7 is connected to each of the gate patterns G4, G5, G6 such that a grid gate pattern is formed in the diode cell C2. By making the gate patterns have a grid structure, it is possible to increase a minimum area of the gate patterns, and possible to prevent a pattern error which occurs in the course of formation of polysilicon.

Second Embodiment

Figure 3:
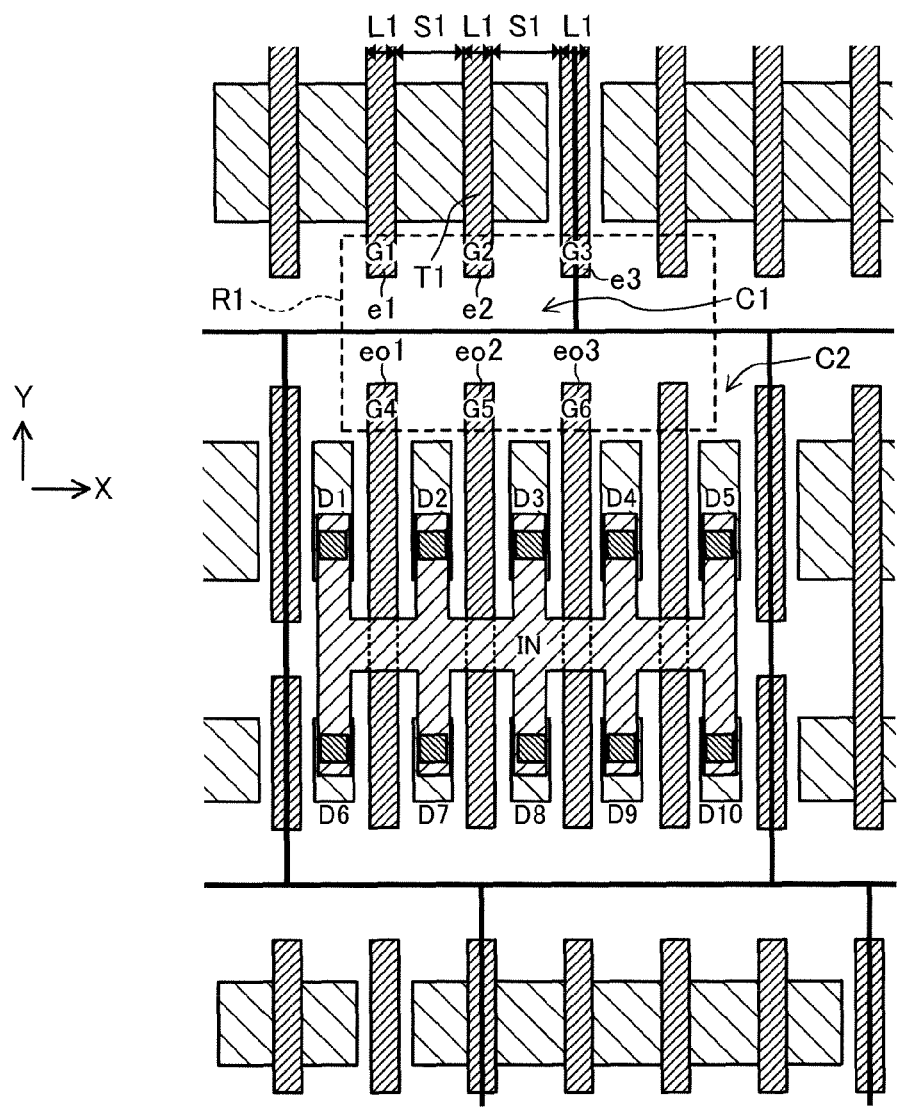
FIG. 3 is a simplified view of a layout pattern of a semiconductor device according to the second embodiment.

FIG. 3 is a simplified view of a layout pattern of a semiconductor device according to the second embodiment. The configuration shown in FIG. 3 is approximately the same as the configuration shown in FIG. 1, but the shapes of the gate patterns and the shapes of the diffusion regions in the diode cell C2 are slightly different. Specifically, in FIG. 3, the gate patterns G4, G5, G6 included in the diode cell C2 are arranged at a pitch equal to the pitch at which the gate patterns G1, G2, G3 included in the standard cell C1 are arranged in X direction; the respective opposite end portions eo1, eo2, eo3 of the gate patterns G4, G5, G6 are located at the same position in Y direction and have an equal width in X direction. Further, diffusion regions D1-D5 are arranged between the gate patterns at an equal pitch in X direction. The end portions of the diffusion regions D1-D5 are located at the same position in Y direction, and have an equal width in X direction. Similarly, diffusion regions D6-D10 are arranged between the gate patterns at an equal pitch in X direction. The end portions of the diffusion regions D6-D10 are located at the same position in Y direction, and have an equal width in X direction. The diffusion regions D1-D10 are connected to each other by a metal wire in the upper layer, and an input connection terminal IN is provided, so the diode cell C2 functions as a protection diode.

According to the present embodiment, the end portions e1, e2, e3 of the gate patterns G1, G2, G3 in the standard cell C1 and the opposite end portions eo1, eo2, eo3 of the gate patterns in the diode cell C2 have the same shape regularity in the end portion region R1 in which the gate patterns G1, G2, G3 included in the standard cell C1 are opposed to the gate patterns G4, G5, G6 included in the diode cell C2. Therefore, it is possible to reliably prevent variations in gate length caused by an optical proximity effect.

Figure 4:
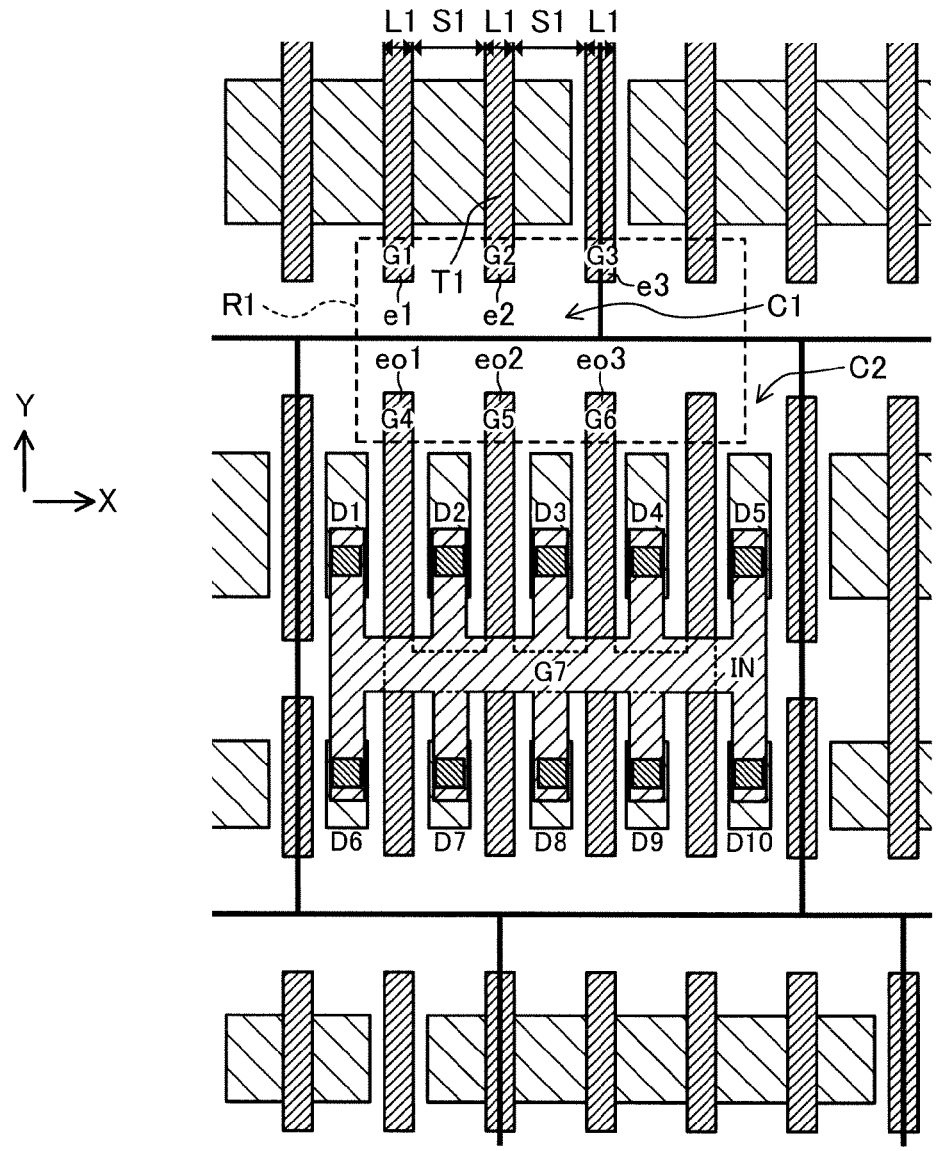
FIG. 4 is a simplified view of a layout pattern of a semiconductor device according to a variation of the second embodiment.

FIG. 4 is a simplified view of a layout pattern of a semiconductor device according to a variation of the present embodiment. The configuration shown in FIG. 4 is approximately the same as the configuration shown in FIG. 3, but the shapes of the gate patterns in the diode cell C2 are slightly different. Specifically, in addition to the gate patterns G4, G5, G6 extending in Y direction, a gate pattern G7 extending in X direction is provided. The gate pattern G7 is connected to each of the gate patterns G4, G5, G6 such that a grid gate pattern is formed in the diode cell C2. By making the gate patterns have a grid structure, it is possible to increase a minimum area of the gate patterns, and possible to prevent a pattern error which occurs in the course of formation of polysilicon.

By making the gate patterns of each cell have the same shape and arranged at the same distance as in the present embodiment, it is possible to predict an amount of change in gate pattern caused by an optical proximity effect, and possible to make corrections by OPC in the state of standard cells. Thus, there is no need to make corrections by OPC after placement of the cells.

Third Embodiment

Figure 5:
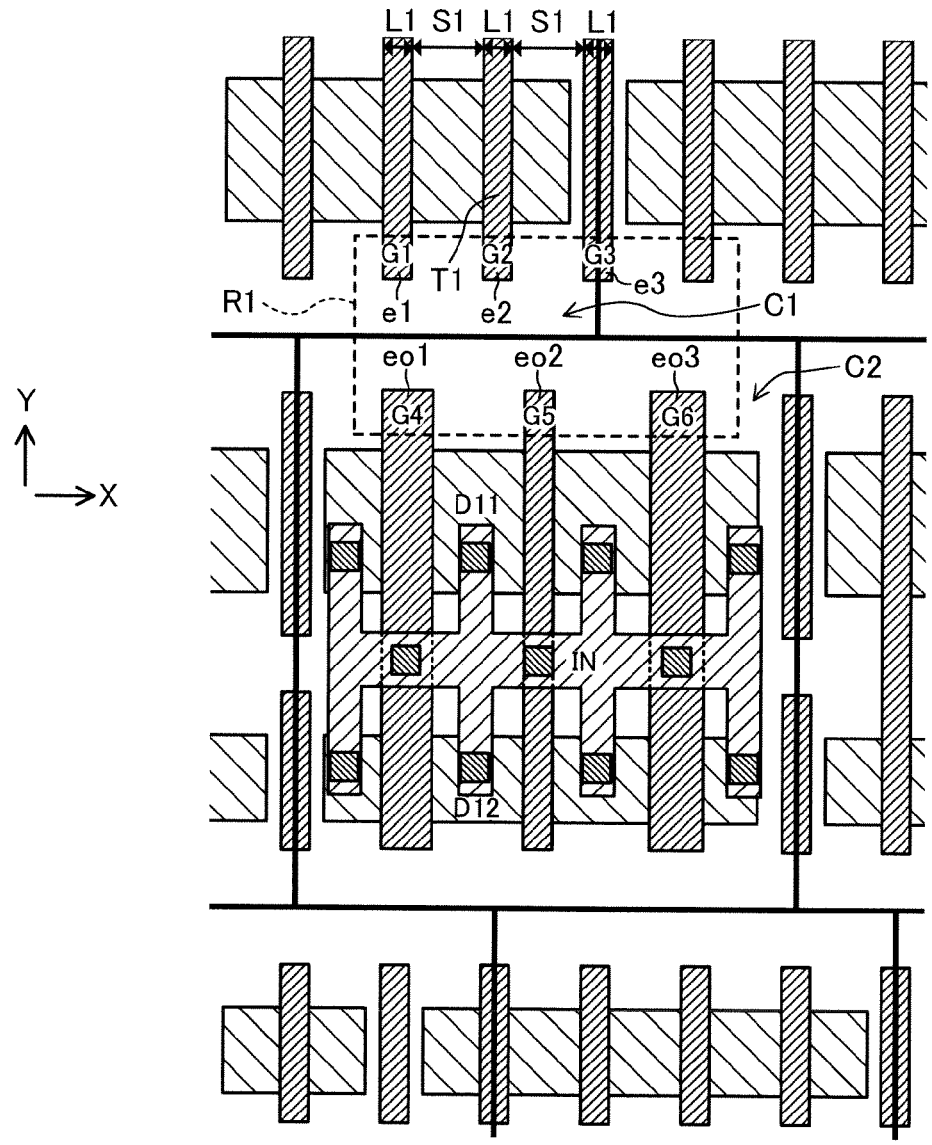
FIG. 5 is a simplified view of a layout pattern of a semiconductor device according to the third embodiment.

FIG. 5 is a simplified view of a layout pattern of a semiconductor device according to the third embodiment. The configuration shown in FIG. 5 is approximately the same as the configuration shown in FIG. 1, but the shapes of the diffusion regions in the diode cell C2 are slightly different. Specifically, in FIG. 5, a diffusion region D11 having a continuous shape in which the diffusion regions D1-D4 of FIG. 1 are connected together and sandwiching the gate patterns G4, G5, G6, is provided. Similarly, a diffusion region D12 having a continuous shape in which the diffusion regions D5-D8 of FIG. 1 are connected together and sandwiching the gate patterns G4, G5, G6, is provided. The gate patterns G4, G5, G6 sandwiched between the diffusion regions D11, D12 function as gates of the transistor. The contacts placed on the gates G4, G5, G6 and the contacts placed on the diffusion regions D11, D12 are connected together by a metal wire in the upper layer to serve as a node, and an input connection terminal IN is provided, so the diode cell C2 functions as a protection diode.

The configuration shown in FIG. 5 can provide a similar effect as the configuration shown in FIG. 1. In addition, since the diffusion regions D11, D12 in the diode cell C2 are continuous diffusion regions, the diffusion regions D11, D12 can be easily formed, and it is possible to prevent misplacement of a contact due to a small diffusion region. Further, the junction capacitance of the diode can be increased by increasing the area of the diffusion region. Furthermore, it becomes possible to provide a plurality of types of diode cells C2 having the same cell size in X direction, thereby preventing an unnecessary increase in junction capacitance of the diode.

Figure 6:
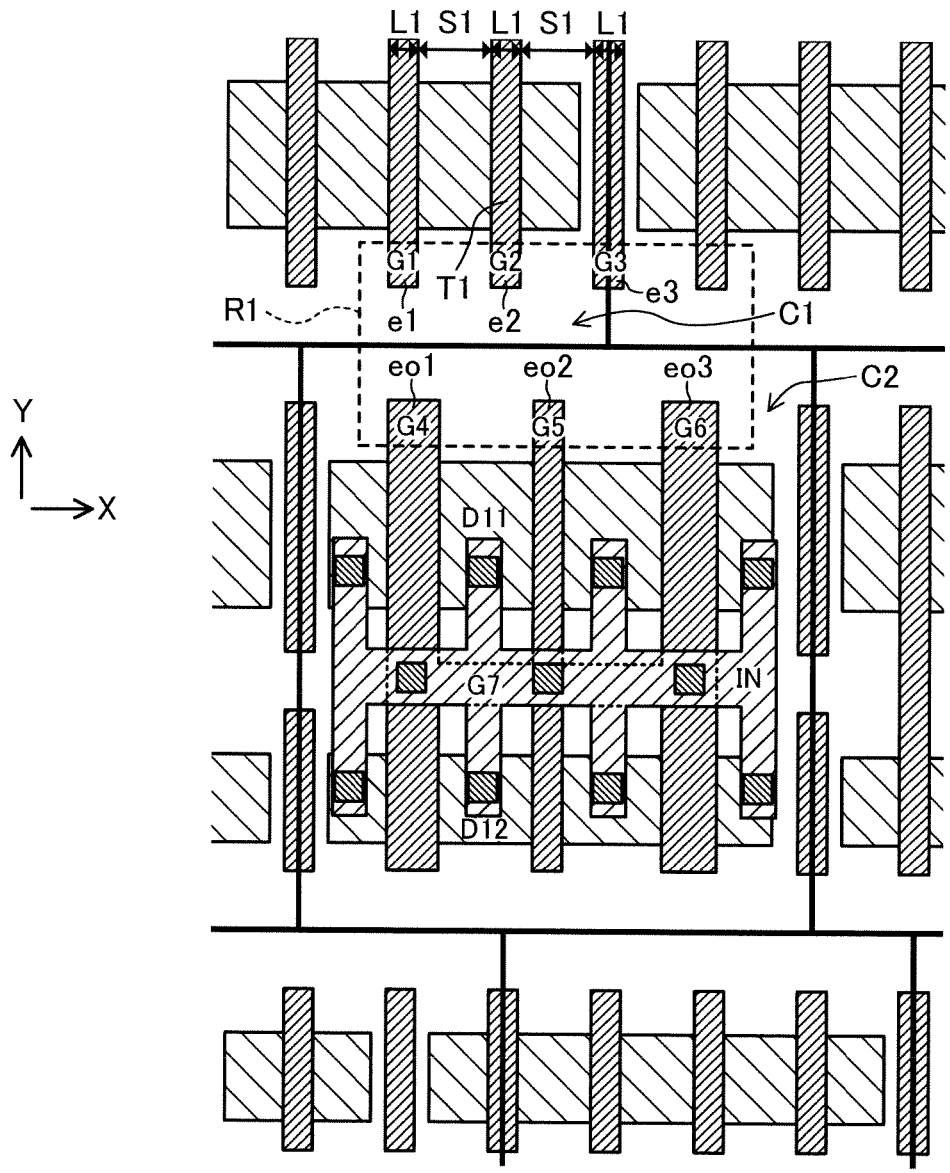
FIG. 6 is a simplified view of a layout pattern of a semiconductor device according to a variation of the third embodiment.

FIG. 6 is a simplified view of a layout pattern of a semiconductor device according to a variation of the present embodiment. The configuration shown in FIG. 6 is the same as the configuration shown in FIG. 2 except that the diffusion regions D1-D4 are replaced with a continuous diffusion region D11, and that the diffusion regions D5-D8 are replaced with a continuous diffusion region D12. Thus, it is possible to obtain an effect similar to the effect of the configuration in FIG. 5 in addition to an effect similar to the effect of the configuration in FIG. 2.

Figure 7:
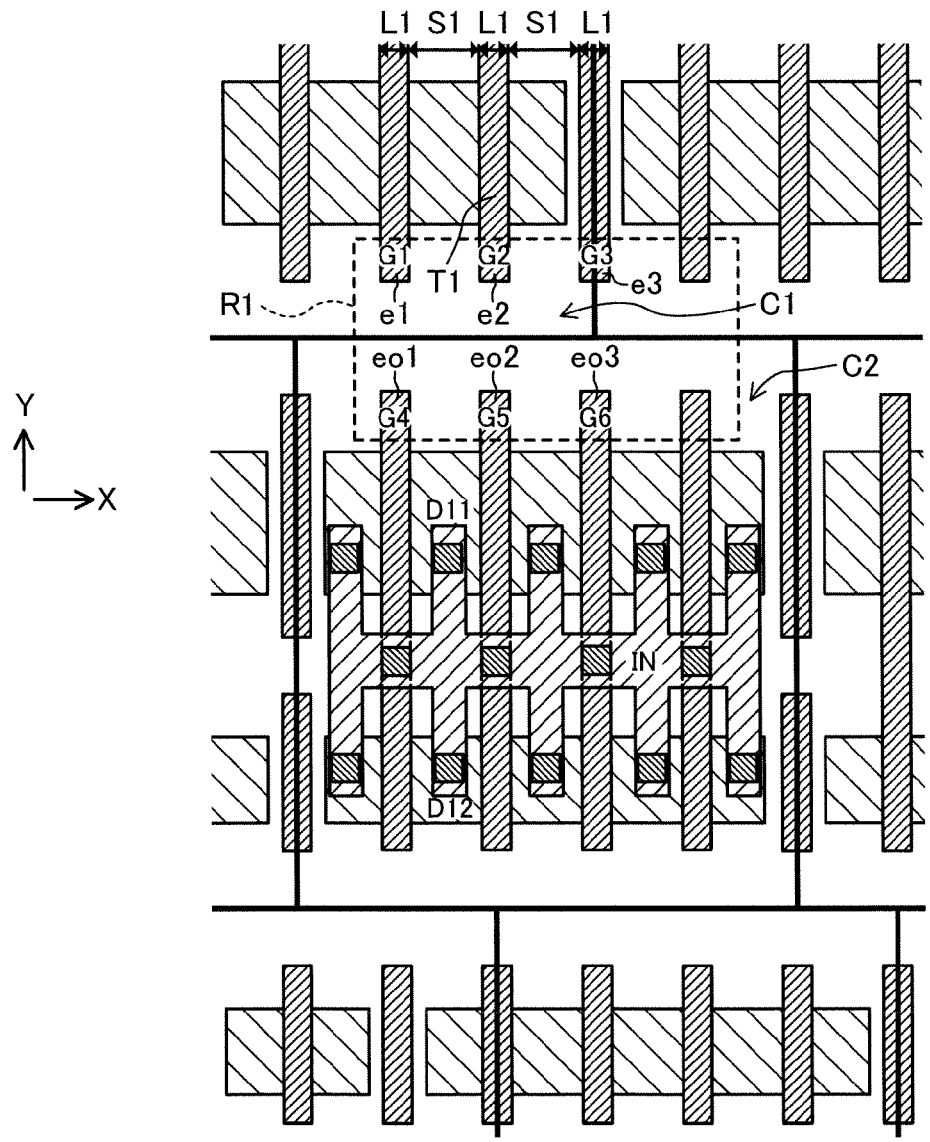
FIG. 7 is a simplified view of a layout pattern of a semiconductor device according to a variation of the third embodiment.

FIG. 7 is a simplified view of a layout pattern of a semiconductor device according to a variation of the present embodiment. The configuration shown in FIG. 7 is the same as the configuration shown in FIG. 3 except that the diffusion regions D1-D5 are replaced with a continuous diffusion region D11, and that the diffusion regions D6-D10 are replaced with a continuous diffusion region D12. Thus, it is possible to obtain an effect similar to the effect of the configuration in FIG. 5 in addition to an effect similar to the effect of the configuration in FIG. 3.

Figure 8:
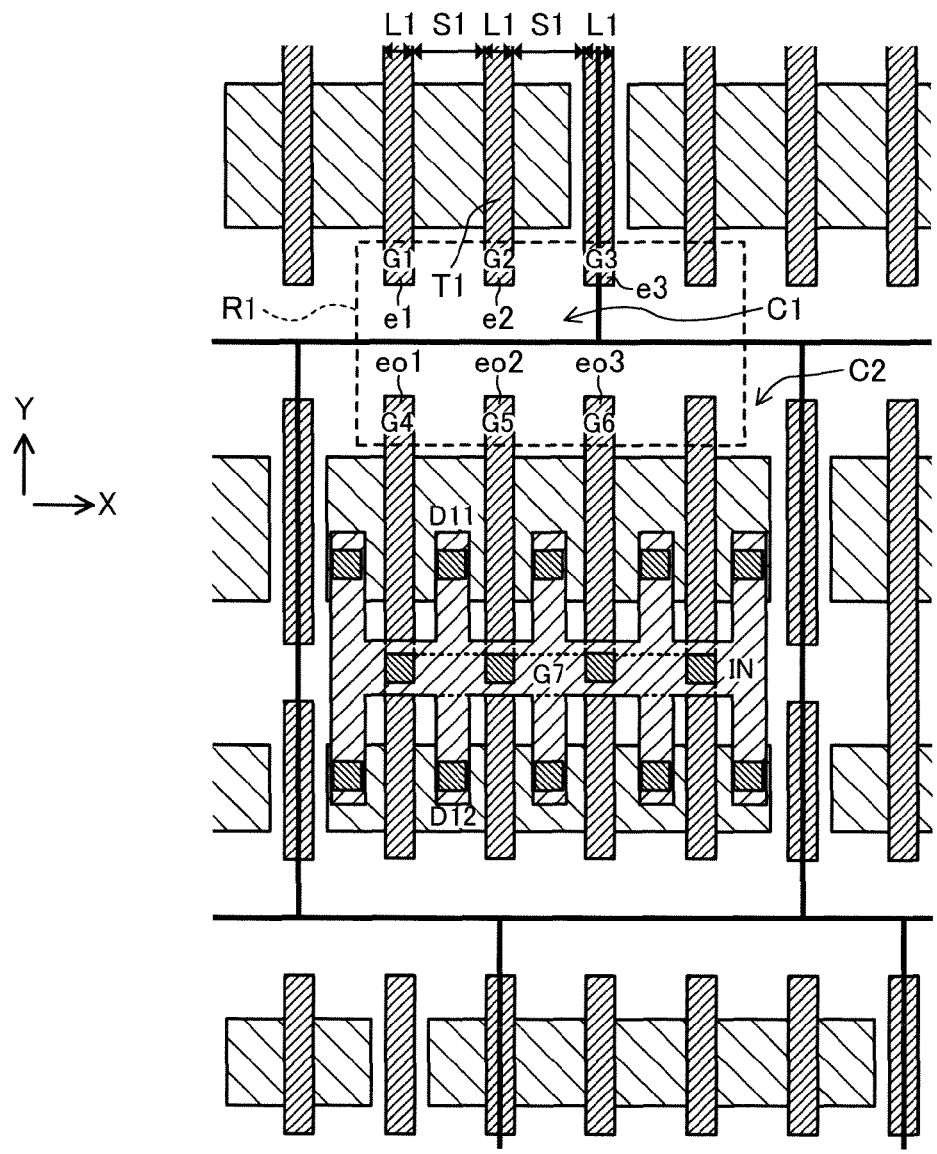
FIG. 8 is a simplified view of a layout pattern of a semiconductor device according to a variation of the third embodiment.

FIG. 8 is a simplified view of a layout pattern of a semiconductor device according to a variation of the present embodiment. The configuration shown in FIG. 8 is the same as the configuration shown in FIG. 4 except that the diffusion regions D1-D5 are replaced with a continuous diffusion region D11, and that the diffusion regions D6-D10 are replaced with a continuous diffusion region D12. Thus, it is possible to obtain an effect similar to the effect of the configuration in FIG. 5 in addition to an effect similar to the effect of the configuration in FIG. 4.

Fourth Embodiment

Figure 9:
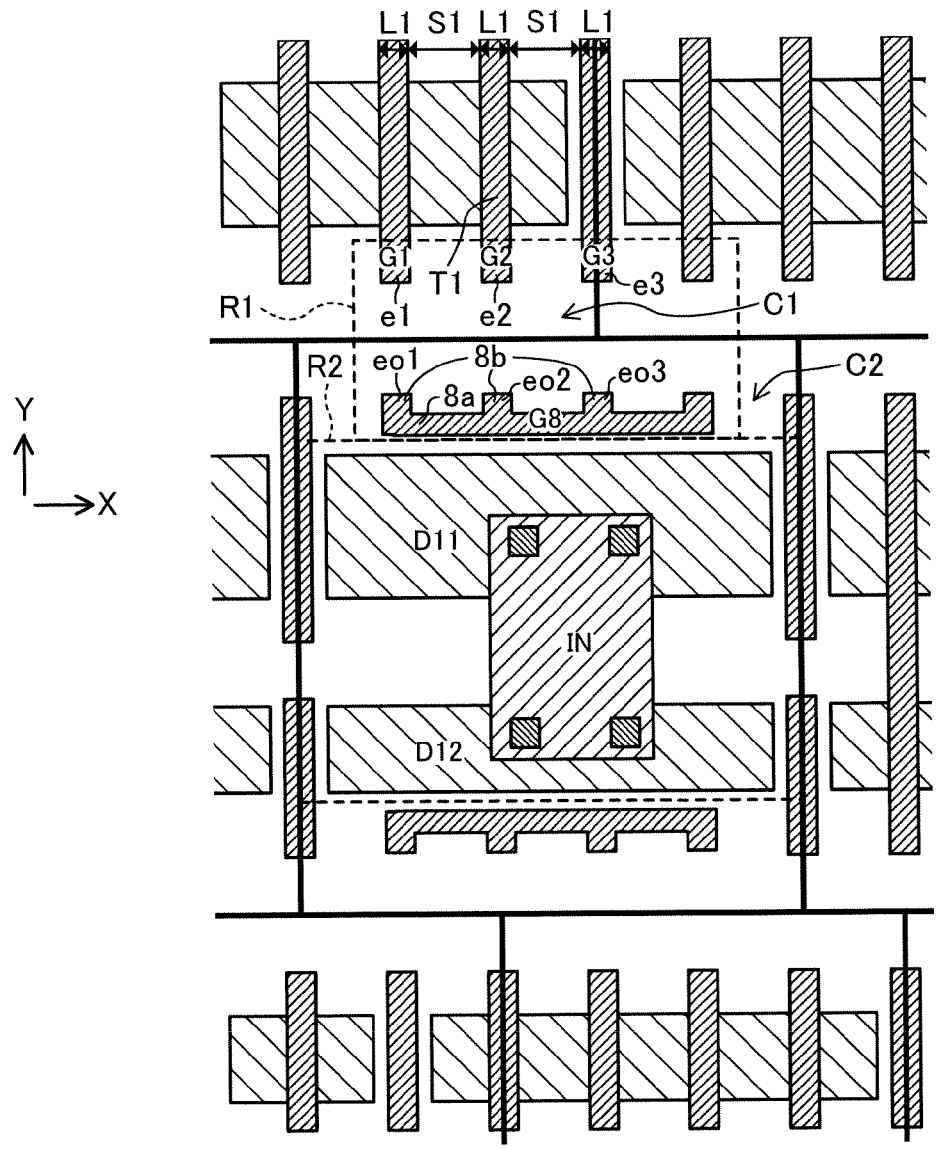
FIG. 9 is a simplified view of a layout pattern of a semiconductor device according to the fourth embodiment.

FIG. 9 is a simplified view of a layout pattern of a semiconductor device according to the fourth embodiment. The configuration shown in FIG. 9 is approximately the same as the configuration shown in FIG. 7. In the end portion region R1, the end portions e1, e2, e3 and the opposite end portions eo1, eo2, eo3 have the same shape regularity. However, the internal configuration of the diode C2 is different from that shown in FIG. 7.

In FIG. 9, the diode cell C2 has a gate pattern G8 which is a dummy pattern. The gate pattern G8 includes a pattern body 8a extending in X direction, and a plurality of protrusions 8b protruding from the pattern body 8a toward the standard cell C1 in Y direction. The protrusions 8b form opposite end portions eo1, eo2, eo3. In other words, the gate pattern G8 has a so-called "crown" shape or "tooth" shape. In a region R2, the contacts placed on the diffusion regions D11, D12 are connected together by a metal wire in the upper layer, and an input connection terminal IN is provided, so the diode cell C2 functions as a protection diode.

According to the configuration shown in FIG. 9, the gate pattern G8 as a dummy pattern attains the same shape regularity as the gate patterns opposed to the gate pattern G8 in the end portion region R1 at the cell boundary between the standard cell C1 and the diode cell C2. Thus, variations in gate length caused by an optical proximity effect can be reliably prevented.

Figure 10:
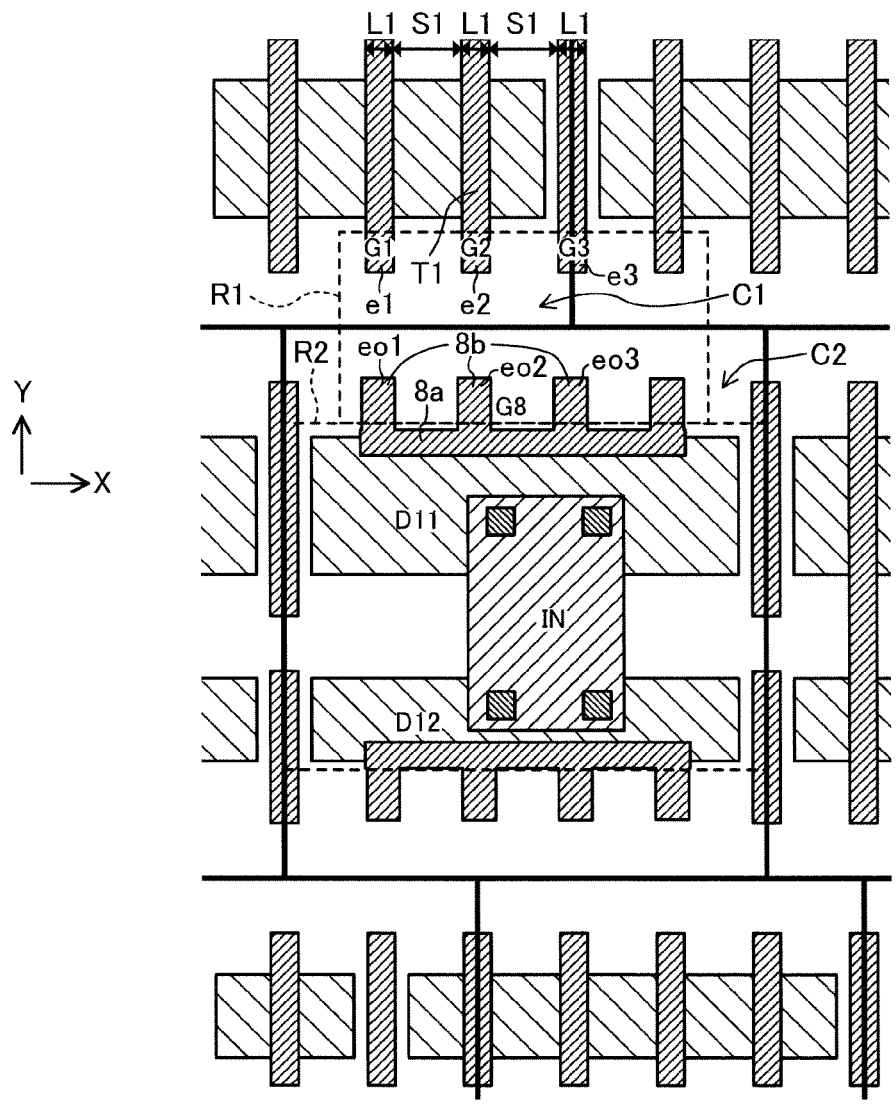
FIG. 10 is a simplified view of a layout pattern of a semiconductor device according to a variation of the fourth embodiment.
Figure 11:
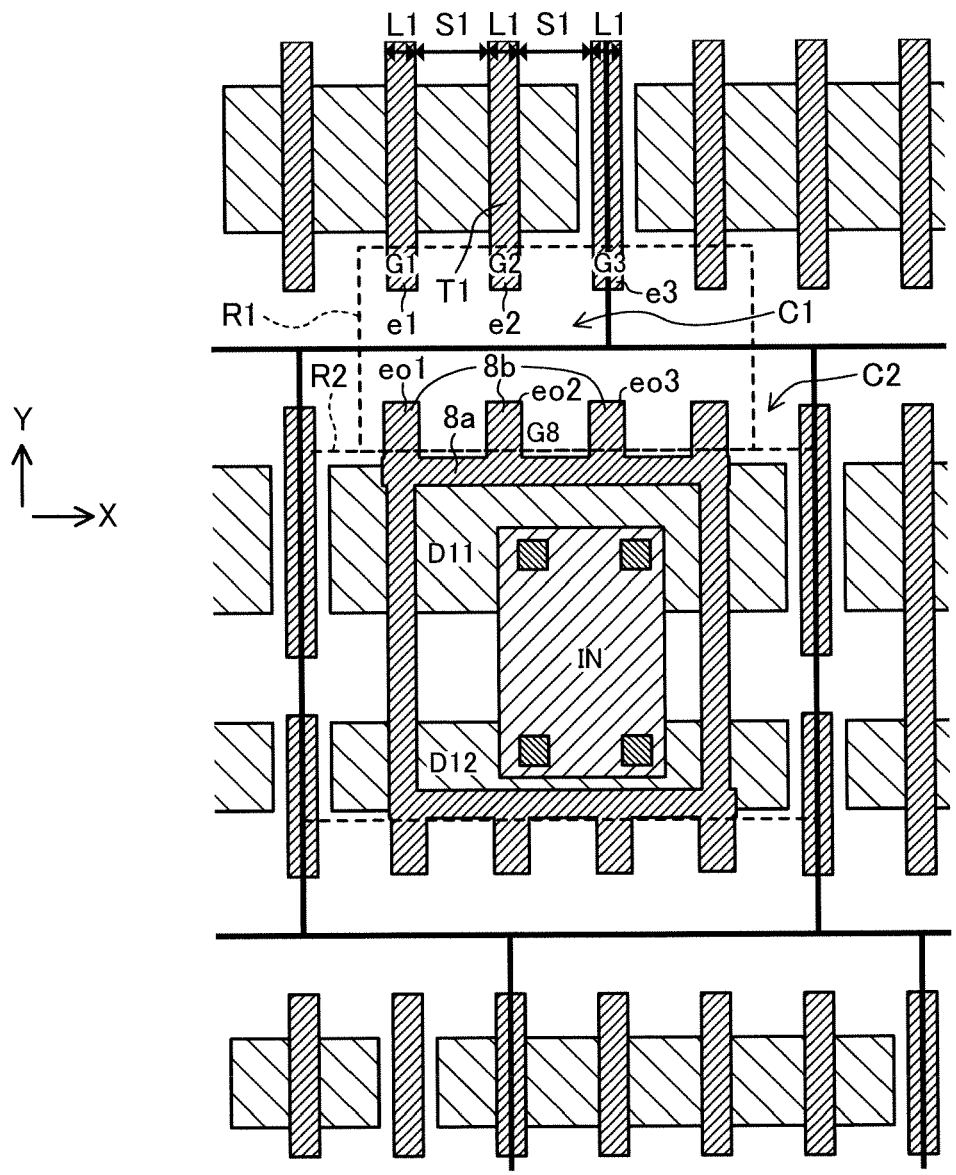
FIG. 11 is a simplified view of a layout pattern of a semiconductor device according to a variation of the fourth embodiment.
Figure 12:
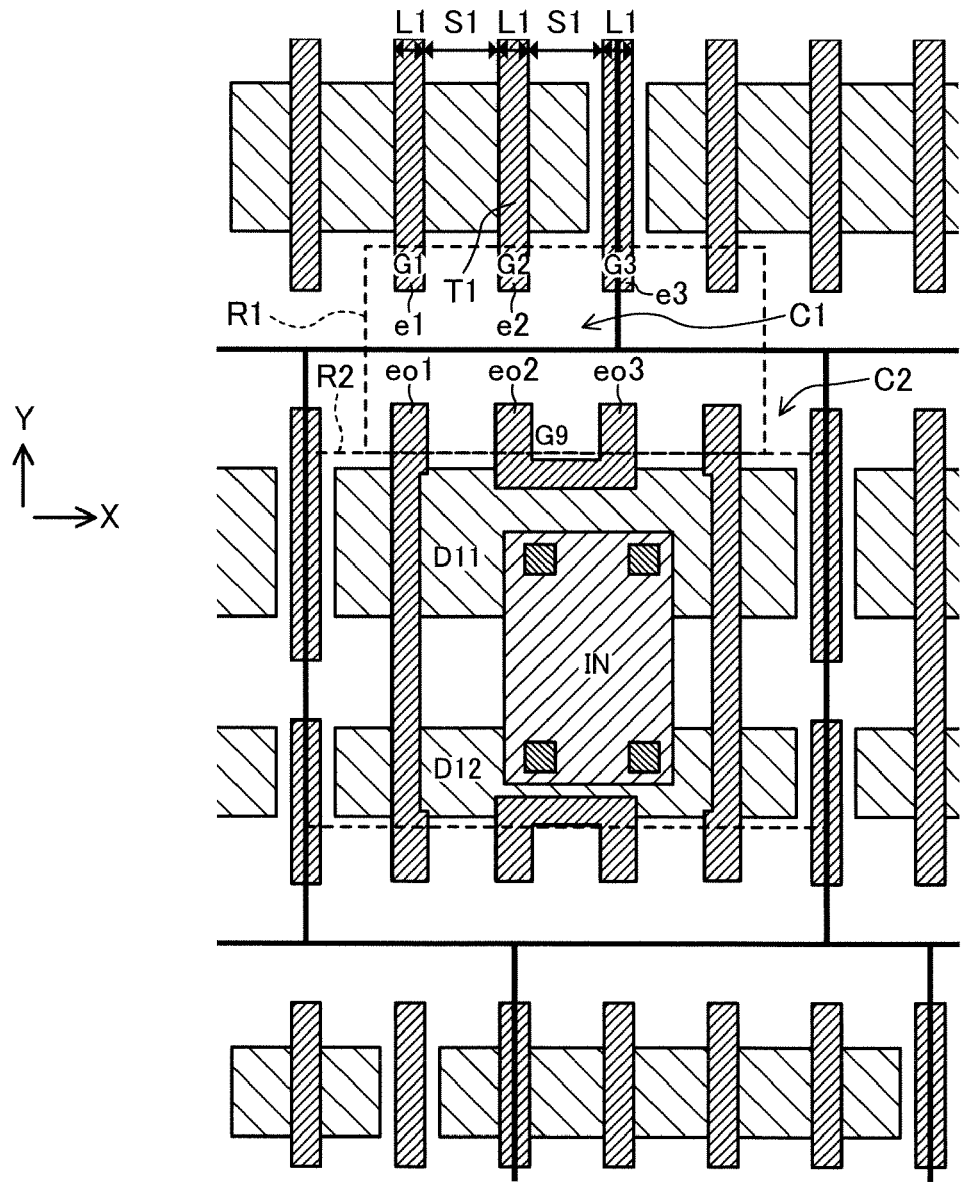
FIG. 12 is a simplified view of a layout pattern of a semiconductor device according to a variation of the fourth embodiment.
Figure 13:
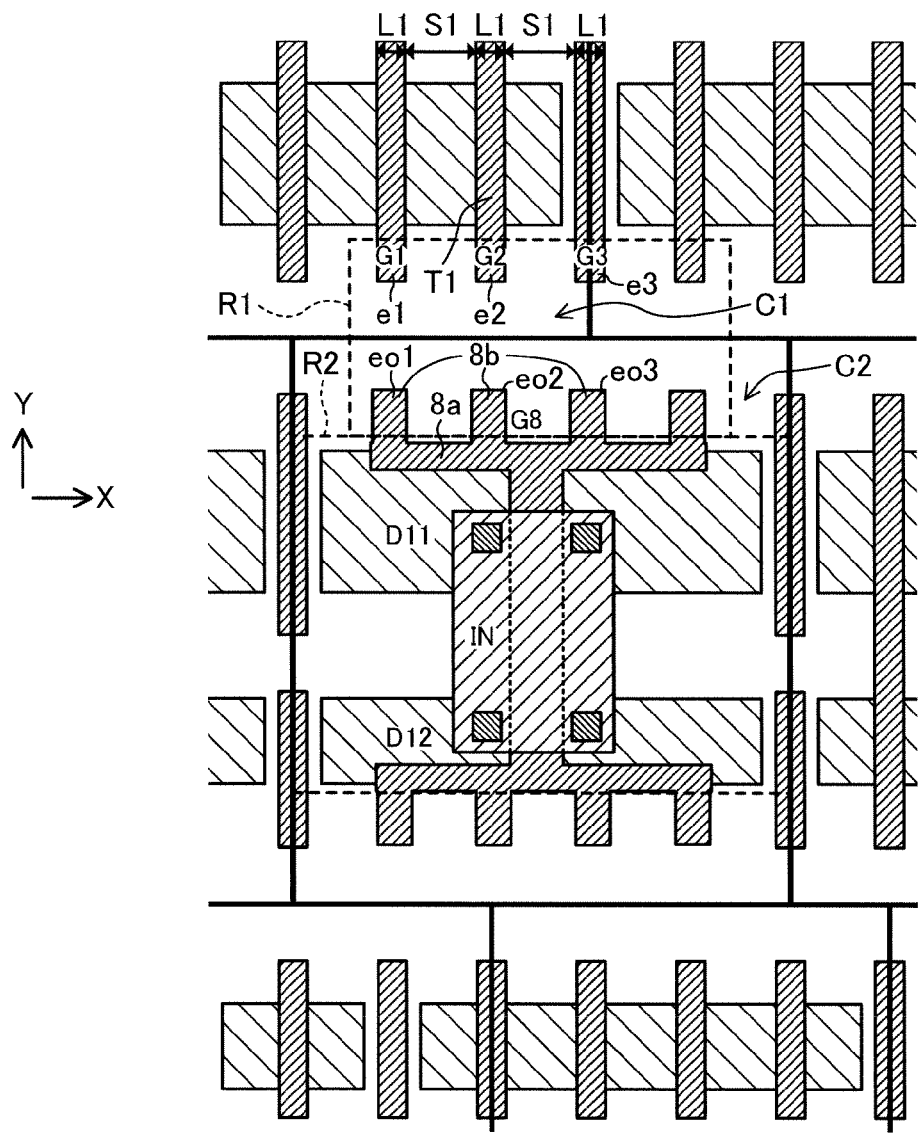
FIG. 13 is a simplified view of a layout pattern of a semiconductor device according to a variation of the fourth embodiment.
Figure 14:
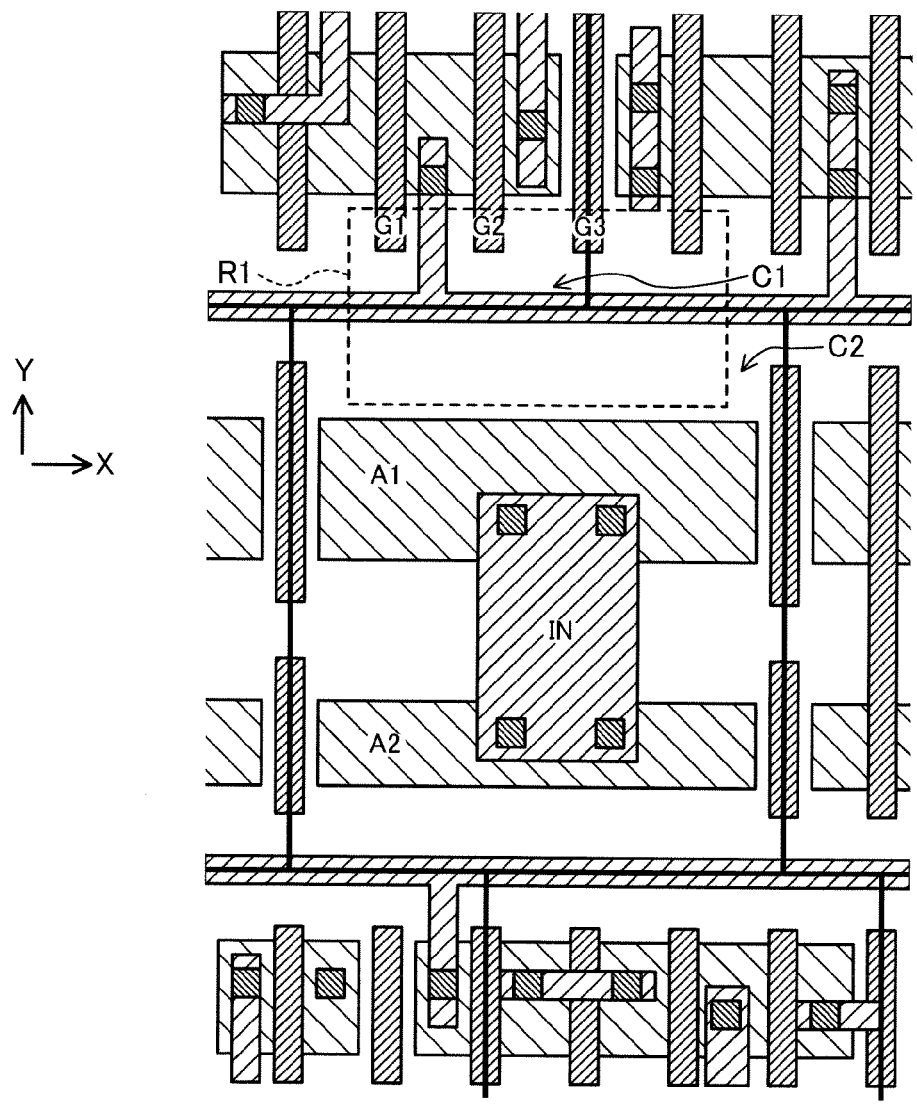
FIG. 14 is a simplified view of a layout pattern of a semiconductor device having a conventional diode cell.

FIGS. 10-13 are simplified views of layout patterns of semiconductor devices according to variations of the present embodiment. In FIG. 10, the gate pattern G8 and the diffusion region D11 are overlapped in the diode cell C2 to ensure the diode area. In FIG. 11, the gate pattern is formed so as to surround the contacts in the diode cell C2. In FIG. 12, a gate pattern G9 as a dummy pattern having two opposite end portions eo2, eo3 is formed in the diode cell C2. In FIG. 13, the gate pattern G8 is connected to another gate pattern in the diode cell C2 to ensure the gate pattern area.

According to a semiconductor device of the present invention, it is possible to reliably prevent variations in gate length caused by an optical proximity effect in a standard cell located next to a diode cell. Thus, there is no need to make a correction again by OPC after placement of the standard cell, which makes it possible to reduce the number of design steps. Thus, for example, the present invention is useful for a semiconductor integrated circuit mounted on various types of electronic equipment.

What is claimed is:

1. A semiconductor device, comprising:
a standard cell having three or more gate patterns extending in a first direction and arranged at an equal pitch along a second direction orthogonal to the first direction; and
a diode cell located next to the standard cell in the first direction, wherein
the gate patterns included in the standard cell terminate near a cell boundary between the standard cell and the diode cell, with respective end portions located at a same position in the first direction and having an equal width in the second direction, and
the diode cell includes:
at least one diffusion layer which functions as a diode; and
a plurality of opposite end portions formed of a gate pattern, which are located near the cell boundary and opposed to the end portions of the gate patterns included in the standard cell.

2. The semiconductor device of claim 1, wherein
the diode cell includes a plurality of gate patterns extending in the first direction and respectively having the plurality of opposite end portions.

3. The semiconductor device of claim 2, wherein
the diode cell includes a second gate pattern extending in the second direction and connected to the plurality of gate patterns such that a grid gate pattern is formed in the diode cell.

4. The semiconductor device of claim 2, wherein
the plurality of gate patterns included in the diode cell are arranged at a pitch equal to the pitch at which the gate patterns included in the standard cell are arranged in the second direction, with the plurality of opposite end portions located at a same position in the first direction and having an equal width in the second direction.

5. The semiconductor device of claim 4, wherein
the diffusion layers included in the diode cell are arranged between the plurality of gate patterns at an equal pitch in the second direction, and have an equal width in the second direction.

6. The semiconductor device of claim 1, wherein
the gate pattern included in the diode cell is a dummy pattern.

7. The semiconductor device of claim 2, wherein
in the diode cell, the diffusion layers are arranged so as to sandwich at least one of the plurality of gate patterns, and the gate pattern sandwiched between the diffusion layers functions as a gate of a transistor.

8. The semiconductor device of claim 1, wherein
the diode cell has a dummy pattern which forms at least part of the plurality of opposite end portions,
the dummy pattern includes a pattern body extending in the second direction, and two or more protrusions protruding from the pattern body toward the standard cell in the first direction, and
the protrusions form the opposite end portions.

* * * * *